United States Patent
Yeh et al.

(10) Patent No.: US 10,355,144 B1
(45) Date of Patent: Jul. 16, 2019

(54) HEAT-DISSIPATING ZENER DIODE

(71) Applicant: AMAZING MICROELECTRONIC CORP., New Taipei (TW)

(72) Inventors: Chih-Ting Yeh, Hsinchu County (TW); Sung-Chih Huang, Yilan County (TW); Che-Hao Chuang, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 16/042,130

(22) Filed: Jul. 23, 2018

(51) Int. Cl.
| | |
|---|---|
| *H01L 29/866* | (2006.01) |
| *H01L 23/34* | (2006.01) |
| *H01L 27/02* | (2006.01) |
| *H01L 29/06* | (2006.01) |
| *H01L 29/66* | (2006.01) |

(52) U.S. Cl.
CPC .......... *H01L 29/866* (2013.01); *H01L 23/34* (2013.01); *H01L 27/0255* (2013.01); *H01L 29/0692* (2013.01); *H01L 29/66106* (2013.01)

(58) Field of Classification Search
CPC ............. H01L 29/866; H01L 29/66106; H01L 29/0692; H01L 23/34; H01L 27/0255
USPC ....... 257/603, 605, 606, 637, 641, 502, 355, 257/E23.167, E27.051, E21.356, E29.005, 257/E29.007, E29.012, E29.013, E29.026, 257/E29.066, E29.335; 438/140, 380, 438/501, 983
See application file for complete search history.

(56) References Cited

U.S. PATENT DOCUMENTS

| | | | |
|---|---|---|---|
| 6,791,161 B2 | 9/2004 | Hamerski | |
| 8,004,041 B2 * | 8/2011 | Ohnishi | H01L 29/885 257/355 |
| 8,415,765 B2 * | 4/2013 | Masada | H01L 29/0619 257/106 |
| 9,331,142 B2 | 5/2016 | Chen et al. | |
| 9,478,441 B1 | 10/2016 | Sridevan | |
| 2003/0071273 A1 * | 4/2003 | Yoshitake | H01L 27/0255 257/104 |
| 2007/0018283 A1 * | 1/2007 | Fujii | H01L 29/66106 257/606 |
| 2010/0084663 A1 * | 4/2010 | Ishii | H01L 29/66106 257/77 |
| 2011/0175199 A1 * | 7/2011 | Lin | H01L 29/0646 257/605 |
| 2013/0175670 A1 * | 7/2013 | Chen | H01L 29/66106 257/603 |

* cited by examiner

*Primary Examiner* — Dao H Nguyen
(74) *Attorney, Agent, or Firm* — Rosenberg, Klein & Lee

(57) ABSTRACT

A heat-dissipating Zener diode includes a heavily-doped semiconductor substrate having a first conductivity type, a first epitaxial layer having the first conductivity type, a first heavily-doped area having a second conductivity type, a second epitaxial layer, and a second heavily-doped area having the second conductivity type or the first conductivity type. The first epitaxial layer is formed on the heavily-doped semiconductor substrate. The first heavily-doped area is formed in the first epitaxial layer and spaced from the heavily-doped semiconductor substrate. The second epitaxial layer is formed on the first epitaxial layer and penetrated with a first doped area, and the first doped area has the second conductivity type and contacts the first heavily-doped area. The second heavily-doped area is formed in the first doped area.

13 Claims, 5 Drawing Sheets

HEAT-DISSIPATING ZENER DIODE

BACKGROUND OF THE INVENTION

Field of the Invention

The present invention relates to a Zener diode, particularly to a heat-dissipating Zener diode.

Description of the Related Art

As the IC device sizes have been shrunk to nanometer scale, the consumer electronics, like the laptop and mobile devices, have been designed to be much smaller than ever. Without suitable protection devices, the functions of these electronics could be reset or even damaged under electrostatic discharge (ESD) events. Currently, all consumer electronics are expected to pass the ESD test requirement of IEC 61000-4-2 standard. Transient voltage suppressor (TVS) is generally designed to bypass the ESD energy, so that the electronic systems can be prevented from ESD damages. The working principle of TVS is shown in FIG. 1. In FIG. 1, the TVS device 10 is connected in parallel with the protected circuit 12 on the printed circuit board (PCB). The TVS device 10 would be triggered immediately when the ESD event occurs. In that way, the TVS device 10 can provide a superiorly low resistance path for discharging the transient ESD current, so that the energy of the ESD transient current can be bypassed by the TVS device 10.

In US patent application No. 20130175670, a Zener diode structure is disclosed. The Zener diode structure includes a first electrode, a first-type semiconductor layer, a second-type semiconductor layer, a second electrode and an insulation layer. The first-type semiconductor layer is a semiconductor layer doped with a first-type dopant, wherein the first-type dopant may be an n-type dopant. The second-type semiconductor layer is a semiconductor layer doped with a second-type dopant, wherein the second-type dopant may be a p-type dopant. The first electrode and the second electrode are metal electrode of opposite polarities. In the instant embodiment, the first electrode is configured as an anode and the second electrode is configured as a cathode. However, the second-type semiconductor layer is not deep enough in the first-type semiconductor layer being a single epitaxial layer. Thus, the transient ESD current flows through the Zener diode structure to produce heat concentrated on the surface of the Zener diode structure. The heat can easily cause damage to the Zener diode structure.

To overcome the abovementioned problems, the present invention provides a heat-dissipating Zener diode, so as to solve the afore-mentioned problems of the prior art.

SUMMARY OF THE INVENTION

A primary objective of the present invention is to provide a heat-dissipating Zener diode, which adds at least one epitaxial layer to deepen and adjust the position of the breakdown junction, thereby enhancing the heat-dissipating efficiency.

To achieve the abovementioned objectives, the present invention provides a heat-dissipating Zener diode, which comprises a heavily-doped semiconductor substrate having a first conductivity type, a first epitaxial layer having the first conductivity type, a first heavily-doped area having a second conductivity type, a second epitaxial layer, and a second heavily-doped area having the second conductivity type or the first conductivity type. The first epitaxial layer is formed on the heavily-doped semiconductor substrate. The first heavily-doped area is formed in the first epitaxial layer and spaced from the heavily-doped semiconductor substrate. The second epitaxial layer is formed on the first epitaxial layer and penetrated with a first doped area, and the first doped area has the second conductivity type and contacts the first heavily-doped area. The second heavily-doped area is formed in the first doped area.

In an embodiment of the present invention, the first conductivity type is a P type and the second conductivity type is an N type.

In an embodiment of the present invention, the first conductivity type is an N type and the second conductivity type is a P type.

In an embodiment of the present invention, the heat-dissipating Zener diode further comprises at least one third epitaxial layer formed between the first epitaxial layer and the second epitaxial layer and penetrated with a second doped area, and the second doped area has the second conductivity type and contacts the first heavily-doped area and the first doped area.

In an embodiment of the present invention, the at least one third epitaxial layer has the second conductivity type and a part of the at least one third epitaxial layer is used as the second doped area.

In an embodiment of the present invention, the at least one third epitaxial layer has the first conductivity type and the second doped area is a heavily-doped area.

In an embodiment of the present invention, the second epitaxial layer has the second conductivity type and a part of the second epitaxial layer is used as the first doped area.

In an embodiment of the present invention, the second epitaxial layer has the second conductivity type and the first doped area is a heavily-doped well.

In an embodiment of the present invention, the second epitaxial layer has the first conductivity type, the second epitaxial layer is a lightly-doped epitaxial layer, and the first doped area is a doped well.

In an embodiment of the present invention, the second epitaxial layer has the first conductivity type and the first doped area is a doped well.

In an embodiment of the present invention, the heat-dissipating Zener diode further comprises a lightly-doped area that has the second conductivity type, and the lightly-doped area is formed in the second epitaxial layer to contact the first doped area and surround the first doped area.

In an embodiment of the present invention, the heat-dissipating Zener diode further comprises an isolation trench embedded in the first epitaxial layer and the second epitaxial layer to contact the first heavily-doped area and the first doped area, the isolation trench surrounds the second heavily-doped area, and the depth of the isolation trench is equal to or deeper than the depth of the first heavily-doped area.

Below, the embodiments are described in detail in cooperation with the drawings to make easily understood the technical contents, characteristics and accomplishments of the present invention.

DETAILED DESCRIPTION OF THE INVENTION

Figure 1:
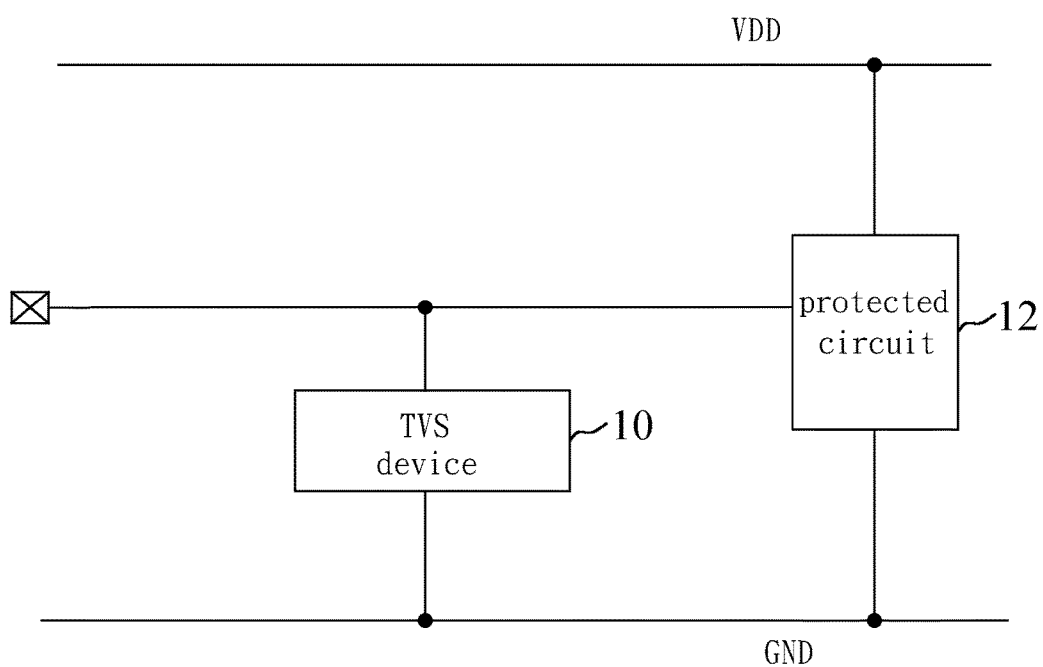
FIG. 1 is a schematic diagram illustrating a transient voltage suppressor (TVS) connected with a protected circuit in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 2:
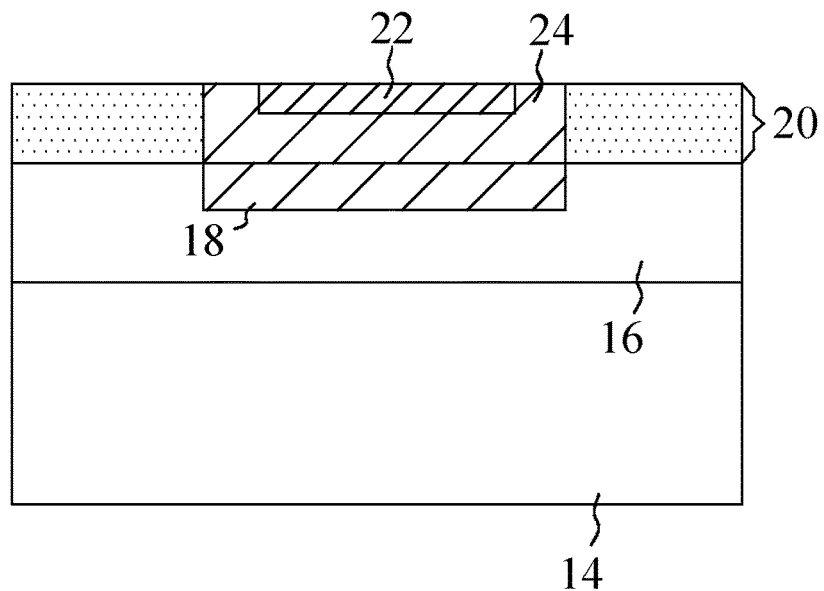
FIG. 2 is a cross-sectional view of a heat-dissipating Zener diode according to the first embodiment of the present invention.

Refer to FIG. 2. The first embodiment of a heat-dissipating Zener diode of the present invention is introduced as follows. The heat-dissipating Zener diode comprises a heavily-doped semiconductor substrate 14 having a first conductivity type, a first epitaxial layer 16 having the first conductivity type, a first heavily-doped area 18 having a second conductivity type, a second epitaxial layer 20, and a second heavily-doped area 22 having the second conductivity type, wherein the heavily-doped semiconductor substrate 14 and the second heavily-doped area 22 are used as ohmic contacts. Alternatively, the second heavily-doped area 22 has the first conductivity type. The first epitaxial layer 16 is formed on the heavily-doped semiconductor substrate 14. The first heavily-doped area 18 is formed in the first epitaxial layer 16 and spaced from the heavily-doped semiconductor substrate 14. The second epitaxial layer 20 is formed on the first epitaxial layer 16 and penetrated with a first doped area 24. The first doped area 24 has the second conductivity type and contacts the first heavily-doped area 18. The second heavily-doped area 22 is formed in the first doped area 24. The breakdown junction exists between the first epitaxial layer 16 and the first heavily-doped area 18. When the first conductivity type is a P type, the second conductivity type is an N type. When the first conductivity type is an N type and the second conductivity type is a P type. Since the present invention adds the second epitaxial layer 20 to deepen and adjust the position of the breakdown junction, heat produced by the transient ESD current is distributed in the whole Zener diode to enhance the heat-dissipating efficiency and avoid the burnout of the Zener diode.

The first embodiment has four cases.

In the first case, the second epitaxial layer 20 has the second conductivity type and a part of the second epitaxial layer 20 is used as the first doped area 24.

In the second case, the second epitaxial layer 20 has the second conductivity type and the first doped area 24 is a heavily-doped well. Compared with the first case, the heavily-doped well used as the first doped area 24 decreases the conduction resistance of the Zener diode. Thus, compared with the first case, the Zener diode of the second case can discharge the larger ESD current.

In the third case, the second epitaxial layer 20 has the first conductivity type, the second epitaxial layer 20 is a lightly-doped epitaxial layer, and the first doped area 24 is a doped well. Due to the lightly-doped epitaxial layer, the breakdown event does not easily occur at the interface between the second epitaxial layer 20 and the first doped area 24 to steady the position of the breakdown junction, In the fourth case, the second epitaxial layer 20 has the first conductivity type and the first doped area 24 is a doped well.

Figure 3:
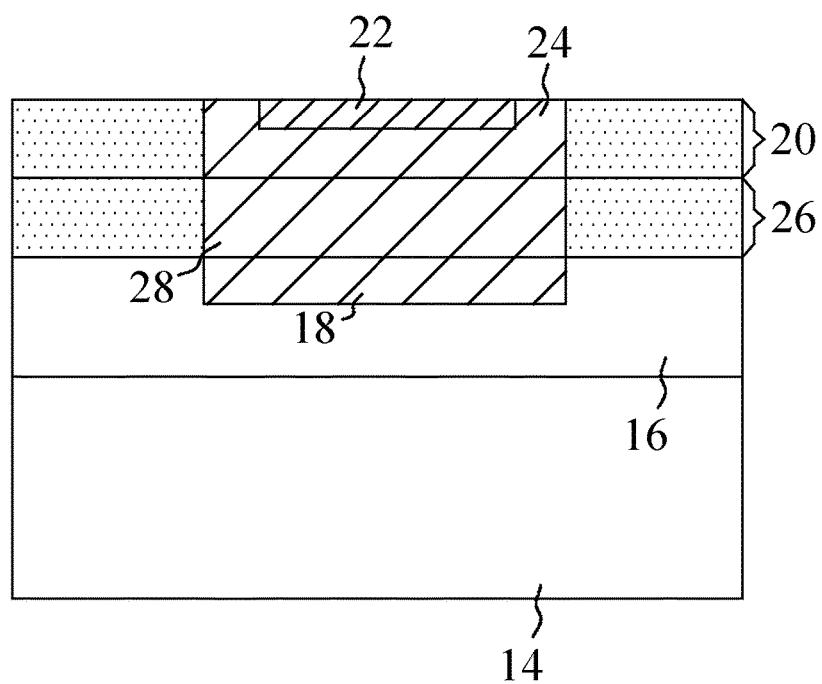
FIG. 3 is a cross-sectional view of a heat-dissipating Zener diode according to the second embodiment of the present invention.

Refer to FIG. 3. The second embodiment of a heat-dissipating Zener diode of the present invention is introduced as follows. The second embodiment is different from the first embodiment in the second embodiment further comprises at least one third epitaxial layer 26 formed between the first epitaxial layer 16 and the second epitaxial layer 20 and penetrated with a second doped area 28, and the second doped area 28 has the second conductivity type and contacts the first heavily-doped area 18 and the first doped area 24. Since the present invention adds the third epitaxial layer 26 to deepen and adjust the position of the breakdown junction, heat produced by the transient ESD current is distributed in the whole Zener diode to enhance the heat-dissipating efficiency and avoid the burnout of the Zener diode.

The second embodiment has two cases.

In the first case, the third epitaxial layer 26 has the second conductivity type and a part of the third epitaxial layer 26 is used as the second doped area 28.

In the second case, the third epitaxial layer 26 has the first conductivity type and the second doped area 28 is a heavily-doped area. Compared with the first case, the heavily-doped area used as the second doped area 28 decreases the conduction resistance of the Zener diode. Thus, compared with the first case, the Zener diode of the second case can discharge the larger ESD current.

Figure 4:
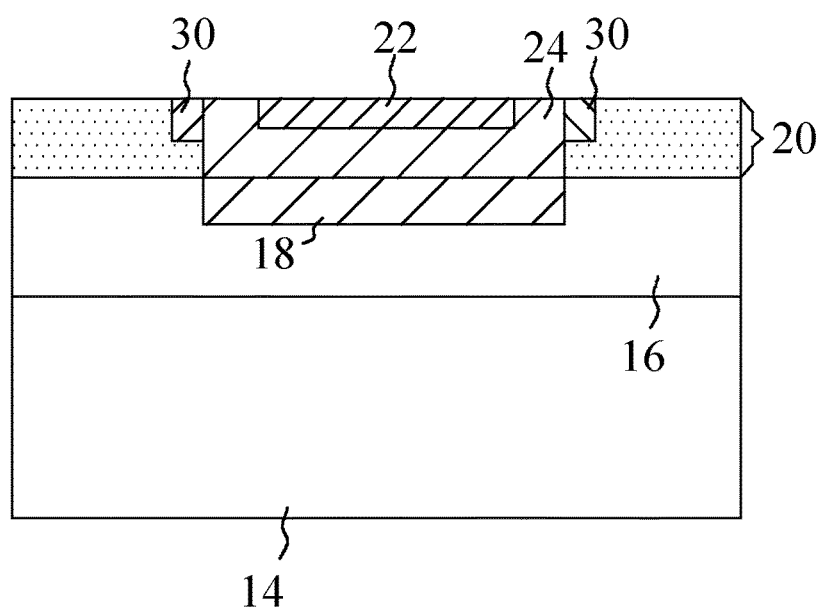
FIG. 4 is a cross-sectional view of a heat-dissipating Zener diode according to the third embodiment of the present invention.
Figure 5:
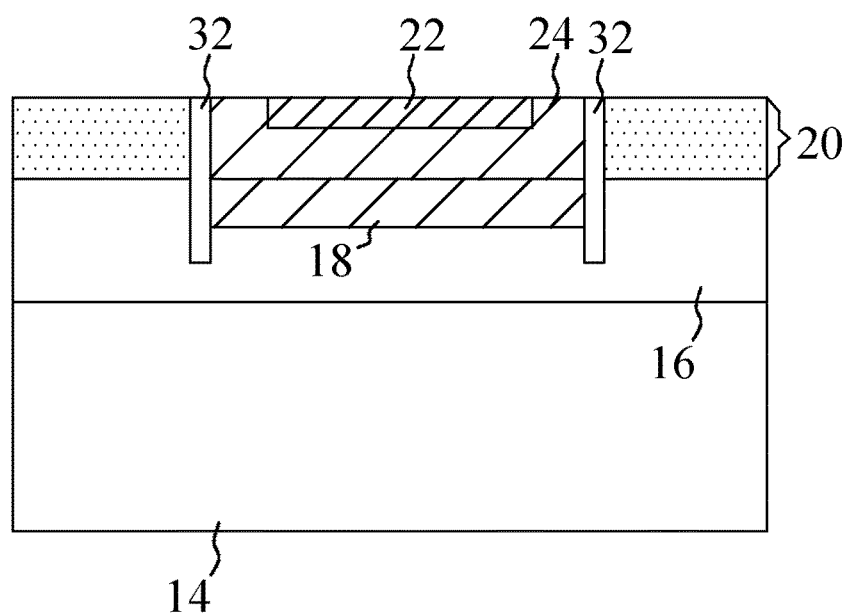
FIG. 5 is a cross-sectional view of a heat-dissipating Zener diode according to the fourth embodiment of the present invention.

Refer to FIG. 4. The third embodiment of a heat-dissipating Zener diode of the present invention is introduced as follows. The third embodiment is different from the first embodiment in the third embodiment further comprises a lightly-doped area 30 that has the second conductivity type, and the lightly-doped area 30 is formed in the second epitaxial layer 20 to contact the first doped area 24 and surround the first doped area 24. Due to the lightly-doped area 30, the breakdown event does not easily occur at the interface between the second epitaxial layer 20 and the lightly-doped area 30 to steady the position of the breakdown junction, Refer to FIG. 5. The fourth embodiment of a heat-dissipating Zener diode of the present invention is introduced as follows. The fourth embodiment is different from the first embodiment in the fourth embodiment further comprises an isolation trench 32 embedded in the first epitaxial layer 16 and the second epitaxial layer 20 to contact the first heavily-doped area 18 and the first doped area 24. The isolation trench 32 may comprise insulation material. The isolation trench 32 surrounds the second heavily-doped area 22, and the depth of the isolation trench 32 is equal to or deeper than the depth of the first heavily-doped area 18. Due to the isolation trench 32, the breakdown event does not occur at the sidewalls of the first heavily-doped area 18 and the first doped area 24 to steady the position of the breakdown junction, In conclusion, the present invention adds at least one epitaxial layer to deepen and adjust the position of the breakdown junction, thereby enhancing the heat-dissipating efficiency.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A heat-dissipating Zener diode comprising:
 a heavily-doped semiconductor substrate having a first conductivity type;
 a first epitaxial layer having the first conductivity type and formed on the heavily-doped semiconductor substrate;
 a first heavily-doped area having a second conductivity type, formed in the first epitaxial layer, and spaced from the heavily-doped semiconductor substrate; and
 a second epitaxial layer formed on the first epitaxial layer and penetrated with a first doped area, and the first doped area has the second conductivity type and contacts the first heavily-doped area.

2. The heat-dissipating Zener diode according to claim 1, wherein the first conductivity type is a P type and the second conductivity type is an N type.

3. The heat-dissipating Zener diode according to claim 1, wherein the first conductivity type is an N type and the second conductivity type is a P type.

4. The heat-dissipating Zener diode according to claim 1, further comprising a second heavily-doped area having the second conductivity type or the first conductivity type and formed in the first doped area.

5. The heat-dissipating Zener diode according to claim 4, further comprising at least one third epitaxial layer formed between the first epitaxial layer and the second epitaxial layer and penetrated with a second doped area, and the second doped area has the second conductivity type and contacts the first heavily-doped area and the first doped area.

6. The heat-dissipating Zener diode according to claim 5, wherein the at least one third epitaxial layer has the second conductivity type and a part of the at least one third epitaxial layer is used as the second doped area.

7. The heat-dissipating Zener diode according to claim 5, wherein the at least one third epitaxial layer has the first conductivity type and the second doped area is a heavily-doped area.

8. The heat-dissipating Zener diode according to claim 1, wherein the second epitaxial layer has the second conductivity type and a part of the second epitaxial layer is used as the first doped area.

9. The heat-dissipating Zener diode according to claim 1, wherein the second epitaxial layer has the second conductivity type and the first doped area is a heavily-doped well.

10. The heat-dissipating Zener diode according to claim 1, wherein the second epitaxial layer has the first conductivity type, the second epitaxial layer is a lightly-doped epitaxial layer, and the first doped area is a doped well.

11. The heat-dissipating Zener diode according to claim 1, wherein the second epitaxial layer has the first conductivity type and the first doped area is a doped well.

12. The heat-dissipating Zener diode according to claim 1, further comprising a lightly-doped area that has the second conductivity type, and the lightly-doped area is formed in the second epitaxial layer to contact the first doped area and surround the first doped area.

13. The heat-dissipating Zener diode according to claim 1, further comprising an isolation trench embedded in the first epitaxial layer and the second epitaxial layer to contact the first heavily-doped area and the first doped area, the isolation trench surrounds the second heavily-doped area, and a depth of the isolation trench is equal to or deeper than a depth of the first heavily-doped area.

* * * * *